United States Patent [19]

Ishikawa et al.

[11] Patent Number: 6,167,554
[45] Date of Patent: *Dec. 26, 2000

[54] COMBINATIONAL LOGIC CIRCUIT, ITS DESIGN METHOD AND INTEGRATED CIRCUIT DEVICE

[75] Inventors: Takashi Ishikawa; Kimiyoshi Usami, both of Tokyo, Japan

[73] Assignee: Kabushiki Kaisha Toshiba, Kawasaki, Japan

[*] Notice: This patent is subject to a terminal disclaimer.

[21] Appl. No.: 08/984,026

[22] Filed: Dec. 3, 1997

[30] Foreign Application Priority Data

Dec. 4, 1996 [JP] Japan .................................. P8-324215

[51] Int. Cl.[7] ................................................... G06F 17/50
[52] U.S. Cl. ........................................ 716/1; 716/5; 716/6
[58] Field of Search .......................... 395/500.11, 500.03, 395/500.5, 500.07; 716/10, 2, 4, 6, 1, 5

[56] References Cited

U.S. PATENT DOCUMENTS

| | | | |
|---|---|---|---|
| 5,517,132 | 5/1996 | Ohara | 326/41 |
| 5,594,368 | 1/1997 | Usami | 326/80 |
| 5,818,256 | 10/1998 | Usami | 326/80 |
| 5,920,089 | 7/1999 | Kanazawa et al. | 257/202 |
| 5,926,396 | 7/1999 | Ohara | 395/500.05 |

OTHER PUBLICATIONS

Jui–Ming Chang and Pedram, M., "Energy Minimization Using Multiple Supply Voltages", International Symposium on Low Power Electronics and Design, 1996, pp. 157–162, Aug. 1996.

Chang, J., and Pedram, M., "Energy Minimization Using Multiple Supply Voltages", Proceedings of the International Symposium on Low Power Electronics and Design, 1996, pp. 157–162, Aug. 14, 1996.

How–Rern Lin and Ting Ting Hwang, "Power Reduction by Gate Sizing with Path–Oriented Slack Calculation", Proceedings of the Asian and South Pacific Design Automation Conference, 1995, pp. 7–12, Sep. 1, 1995.

Usami, K., and Horowitz, M., "Clustered Voltage Scaling Technique for Low–power Design", Proceedings of the International Symposium on Low Power Design, 1995, pp. 3–8, Apr. 1995.

*Primary Examiner*—Paul R. Lintz
*Assistant Examiner*—Vuthe Siek
*Attorney, Agent, or Firm*—Foley & Lardner

[57] ABSTRACT

A combinational logic circuit having at least one primary input terminal and at least one primary output terminal comprises a plurality of VDDH gates having an input node and an output node and operated by a standard operating voltage and a plurality of VDDL gates having an input node and output node and operated by an operating voltage which is lower than the standard operating voltage. At least one of the VDDH gates is multiple input gate. An output node of the VDDH gate or primary input terminal operated by the standard operating voltage is connected to at least one of the input nodes of the multiple input gate. The VDDL gate or the primary output terminal operated at the operating voltage which is lower than the standard operating voltage is connected to at least one of the other input nodes of the multiple input gate through a level converter.

2 Claims, 14 Drawing Sheets

COMBINATIONAL LOGIC CIRCUIT, ITS DESIGN METHOD AND INTEGRATED CIRCUIT DEVICE

BACKGROUND OF THE INVENTION

1. Field of the Invention

This invention relates to a combinational logic circuit intended for reducing power consumption, its design method and integrated circuit device.

2. Description of the Prior Art

Most of the power consumption in CMOS circuit results from charging and discharging of load and is proportional to the square of voltage of an applied power. Therefore, a method of reducing power voltage is very effective for reduction of power consumption. However, because circuit delay time is increased if the power voltage is reduced, if the power voltage of each gate is reduced without any special reason, like for example, reducing the power voltages of all gates, the timing restriction (maximum delay time) requested for a circuit is not satisfied so that reduction of performance is induced.

Japanese Patent Application Laid-Open Publication No. 7-249067 has disclosed an art for achieving reduction of consumption power without increasing the maximum signal transmission delay time of critical path.

FIG. 1 is a block diagram showing an example of a conventional semiconductor integrated circuit (first prior art example) disclosed in the above Japanese application.

In this semiconductor integrated circuit, a plurality of registers 101, 102, 103, 104 comprising flip-flop circuits operating according to clock CLK and combinational circuits 111, 112, 113, 114 are disposed alternately with these registers 101–104, the registers and combinational circuits being connected in series between INPUT and OUTPUT.

The combinational circuit 113 having the critical path is driven by a high power supply (3v) and other combinational circuits 111, 112, 114 having no critical path are driven by a low power supply (2v). An output portion of the register 102 located ahead of the combinational circuit 113 having the critical path is provided with a level converter for converting a low-voltage signal to a high-voltage signal.

However, according to the aforementioned method, timing analysis is conducted between the registers. Then, a circuit 113 (having no sufficient allowance in timing) having a critical path is operated with a high voltage power supply (3v) and other combinational circuits 111, 112, 114 (having an allowance in timing) having no critical path are operated by a low voltage power supply (2v).

In this method in which each register is sectioned for carrying out timing analysis so as to attain reduction of power consumption, detailed timing analysis in each signal path inside the combinational circuit is not carried out. Thus, this prior art has a limitation in reduction of power consumption therein.

That is, a number of signal paths exist in each of the combinational circuits provided between the registers and the combinational circuit 113 set by a high voltage power supply as its operating power contains a number of signal paths as well as critical path. The number of signal paths except this critical path are paths having a sufficient allowance in timing. Although the operating voltage can be reduced for the gates on this path, the aforementioned prior art patent did not pay attention to this point.

FIG. 2 is a circuit diagram showing an example of the combinational circuit in a semiconductor integrated circuit.

In this combinational circuit, gates 151, 152, 153, 154 are connected between a primary input terminal i1 and a primary output terminal o1, and gates 155, 156 are connected between a primary input terminal i2 and a primary output terminal o2. Further, gates 157, 158, 159 are connected between a primary input terminal i3 and a primary output terminal o3 and a gate 160 is connected between a primary input terminal i4 and a primary output terminal o4. Further, a primary input terminal i5 is connected to a gate 159.

When, in the logic circuit having such a structure, gates to which high operating voltage VDDH is supplied and gates to which low operating voltage VDDL is supplied are determined while the timing restriction is satisfied, a structure as shown in FIG. 3 is sometimes generated in the prior art. In FIG. 3, between the VDDL gate distinguished by hatching and VDDH gate are level converters 171–176. That is, the structure shown in FIG. 3 has a number of connection structures in which the output of the VDDL gate is included in the input of the VDDH gate. Thus, a number of level converters for amplifying an amplitude of output voltage of the VDDL gate up to a magnitude necessary for driving the VDDH gate are required.

FIG. 4 shows a typical level converter circuit. This level converter circuit comprises a pair of P-channel transistors MP2, MP3 one drain of which is connected to the other gate thereof. The P-channel transistor MP2 is connected to the ground level by means of the N-channel transistor MN2 and the other P-channel transistor MP3 is connected to the ground level by means of the second N-channel transistor MN3. These N-channel transistors MN2, MN3 are operated by the operating voltage VDDL and are turned ON/OFF by inputting the output signal of a gate (not shown) operated by the operating voltage VDDL. Because the inverter IB1 is provided between the MN2 and MN3, when one of them is turned ON, the other is turned OFF.

Even if a circuit operated by the operating voltage VDDL is directly connected to the output of a circuit operated by the operating voltage VDDH, the high level of the input of the circuit operated by the operating voltage VDDL is raised up to the operating voltage VDDH. Thus, the P-channel transistor is completely turned off so that no DC current flows.

The level converter having the aforementioned structure has a function for interrupting DC current, however consumes a considerably large dynamic power at the time of switching. Therefore, as the number of the level converters increases, the amount of power consumed in the entire level converters increases, thereby weakening the effect of reduction of power consumption. Because the installation of the level converter consumes a considerably large dynamic power, a structure in which a number of the level converters are inserted does not coincide with a purpose for reducing the power consumption.

To solve this problem, this applicant has already proposed the following method (second prior art example) (Japanese Patent Application Laid-Open Publication No. 9-162720).

According to this method, as shown in FIG. 5, the VDDH gates are gathered on the input terminal side of the combinational logic circuit so as to form a VDDH cluster 180 and the VDDL gates are gathered on the output terminal side so as to form a VDDL cluster 181. According to this method, only by inserting the level converters 191–194 just before partial output terminals, the power voltage of many gates can be reduced to VDDL level so that the power consumption can be largely reduced.

According to this circuit design method, first of all, a logic circuit in which the timing restriction is satisfied when the operating voltage VDDH is supplied to the entire gate of the combinational circuit is designed and subsequently, whether or not the operating voltage VDDH can be changed to the operating voltage VDDL is considered about each of the gates one by one from the primary output terminal to the primary input terminal. On this consideration stage, if the entire logic circuit satisfies the timing restriction when the operating voltage VDDL is supplied to one gate, the voltage to be supplied to that gate is determined to be the operating voltage VDDL. If the timing restriction is not satisfied, the voltage to be supplied to that gate and a gate connected to its input terminal is determined to be the operating voltage VDDH.

However, the above described second prior art example has the following problem.

This example will be described concretely with reference to FIGS. 6A, 6B.

A logic circuit in which a predetermined timing restriction is satisfied when the operating voltage VDDH is supplied to the entire gate of the combinational circuit is designed. This logic circuit is as shown in FIG. 6A to simplify the description thereof. That is, between a primary input terminal I1 and a primary output terminal O1 are connected gates 201, 202, 203, 204. Between a primary input terminal I2 and a primary output terminal O2 are connected gates 211, 212, 213. On the other hand, an output of the gate 202 is connected to the other input terminal of the gate 213.

According to the aforementioned design method, in such a logic circuit, a gate for supplying the operating voltage VDDH and a gate for supplying the operating voltage VDDL while the timing restriction is satisfied are determined. The logic circuit shown in FIG. 6A contains three signal paths. A first path P1 is a path extending from the input terminal I1 to the output terminal O1 (input terminal I1→gates 201→gate 202→gate 203 gate 204→output terminal O1). A second path P2 is a path extending from the input terminal I1 to the output terminal O2 (input terminal I1→gate 201 →gate 202→gate 213→output terminal O2). A third path P3 is a path extending from the input terminal I2 to the output terminal O2 (input terminal I2→gate 211→gate 212→gate 213→output terminal O2).

About each of these three paths P1, P2, P3, whether or not the operating voltage VDDH can be changed to the operating voltage VDDL is considered with respect to each of the gates one by one from the primary output terminal to the primary input terminal. As a result, a logic circuit having a structure shown in FIG. 6B is realized.

That is, only the gates 203, 204 are the VDDL gates, and assuming that the output terminal O1 is the VDDH level, the level converter 214 is inserted between the gate 204 and the output terminal O1.

At this time, the VDDL gate output cannot be connected to the input of the VDDH gate. Thus, when the power voltage of a predetermined gate (gate 213) cannot be lowered to the VDDL level because of the timing restriction of a path (second path P2), the gates 211, 212 on the input side with respect to the gate 213, located on another path (third path P3) passing the gate 213 cannot be converted to the VDDL gate even if there is an allowance in timing.

As described above, the second prior art example has a point to be improved in viewpoints of reduction of the power consumption.

SUMMARY OF THE INVENTION

Accordingly, the present invention has been proposed to solve the above described problem. It is an object of the present invention to provide a combinational logic circuit wherein the number of level converters used is minimized and reduction of the power voltage in as many logic gates as possible from the standard voltage level to the low voltage level can be attained. Another object of the present invention is to provide a design method for the combinational logic circuit, capable of designing the aforementioned combinational logic circuit effectively. A still another object of the present invention is to provide an integrated circuit device wherein the number of the level converters used is minimized and reduction of the power voltage in as many logic gates as possible from the standard voltage level to the low voltage level can be attained.

To achieve the aforementioned object, there is provided a combinational logic circuit having at least one primary input terminal and at least one primary output terminal, the combinational logic circuit comprising: at least one first gate having an input node and output node, which is operated by a first operating voltage; and at least one second gate having an input node and output node, which is operated at a second operating voltage which is lower than the first operating voltage, wherein at least one of the at least one first gate is a multiple input gate and the output node of the first gate or the primary input terminal operated by the first operating voltage is connected to at least one of the input node of the multiple input gate and the second gate or the primary input terminal operated by the second operating voltage is connected to at least one of other input nodes of the multiple input gate through a first level converter.

According to the present invention, the power voltage of part of the logic gate on a path excluding the critical path or a path having an allowance in timing is lowered to a second operating voltage which is lower than a first operating voltage (for example, standard voltage). Thus, the power voltage of as many gates as possible can be reduced only by inserting a small number of the level converters. For example, if because of the timing restriction of a path, the power voltage of a predetermined logic gate cannot be reduced to the second operating voltage, gates located on the input side with respect to that gate on another path passing that gate can be reduced to the second operating voltage if there is an allowance in timing.

According to another aspect, there is provided an integrated circuit device comprising: I/O portion for connecting to an external circuit; a logic circuit portion for controlling an entire operation of a processor, which contains at least one primary input terminal and at least one primary output terminal; and a macro block in which a state transition thereof is controlled according to signals from the logic circuit portion, the logic circuit portion including: a plurality of first gates having an input node and an output node and operated at a first operating voltage; and a plurality of second gates having an input node and an output node and operated at a second operating voltage which is lower than the first operating voltage, wherein at least one of the plurality of first gates is a multiple input gate and the output node of one of the plurality of first gates or the primary input terminal operated by the first operating voltage is connected to at least one of the input node of the multiple input gate and one of the plurality of second gates or the primary input terminal operated by the second operating voltage is connected to at least one of other input nodes of the multiple input gate through a first level converter.

According to still another aspect, there is provided a design method for the combinational logic circuit for designing the combinational logic circuit having at least one primary input terminal, at least one primary output terminal and logic gates connected therebetween, the design method comprising: a first step for designing a logic circuit which satisfies a predetermined timing restriction when a first operating voltage is supplied to entirely the logic gates; and a second step for considering whether or not the first operating voltage can be changed to a second operating voltage which is lower than the first operating voltage, with respect to every logic gate from a logic gate nearest an output side on each path specified by the timing restriction, the second step including a step in which, when the timing restriction cannot be satisfied for the path in a case in which the second operating voltage is newly supplied to one of the logic gates, the voltage to be supplied to the newly supplied logic gate and all logic gates on the path located on the input side with respect the newly supplied logic gate is determined to be the first operating voltage, wherein, after the second step is executed with respect to all paths specified by the timing restriction, it is determined that the first operating voltage is supplied to a logic gate at least once determined to be supplied with the first operating voltage and that the second operating voltage is supplied to a logic gate never determined to be supplied with the first operating voltage.

The nature, principle and utility of the invention will become more apparent from the following detailed description when read in conjunction with the accompanying drawings.

DETAILED DESCRIPTION OF THE PREFERRED EMBODIMENTS

Hereinafter, embodiments of the present invention will be described with reference to the accompanying drawings.

Figure 7:
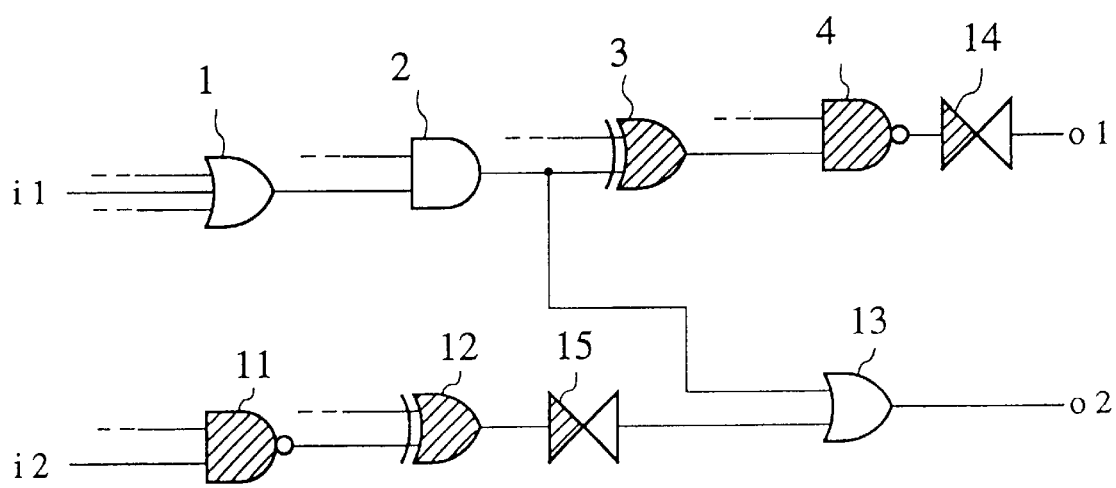
FIG. 7 is a partial circuit diagram of a combinational logic circuit according to a first embodiment.
Figure 8:
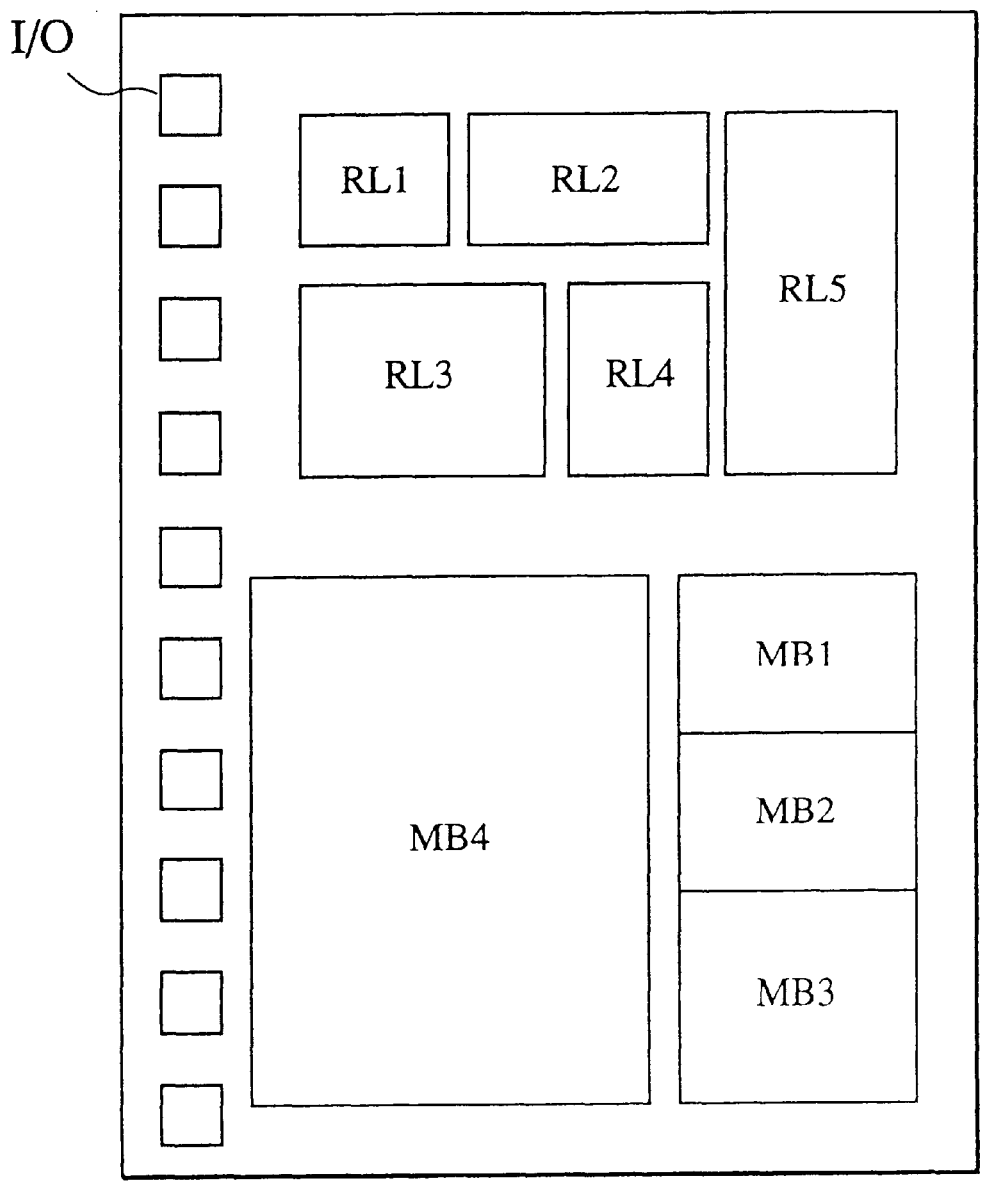
FIG. 8 is a diagram showing an entire LSI chip designed using the present invention.

FIG. 7 is a partial circuit diagram of a combinational logic circuit according to a first embodiment of the present invention. FIG. 8 is a diagram for showing an entire LSI chip such as gate array, standard cell and the like, designed according to the present invention.

First, in FIG. 8, this LSI chip comprises largely three portions. That is, this LSI chip comprises I/O portions for connecting to external circuits, function blocks MB1–MB4 composed of megacells the circuit structure including layout of which has been designed, such as memory and multiplier, and function blocks RL1–RL5 comprising random logics.

Of these components, the portion to which the design method of the present invention is applicable is random logic portion RL1–RL5 in which logic is achieved. When the present invention is applied to full-custom chip such as micro processor and DSP, if it is applied to mainly their control logic, a great effect can be achieved.

Figure 9:
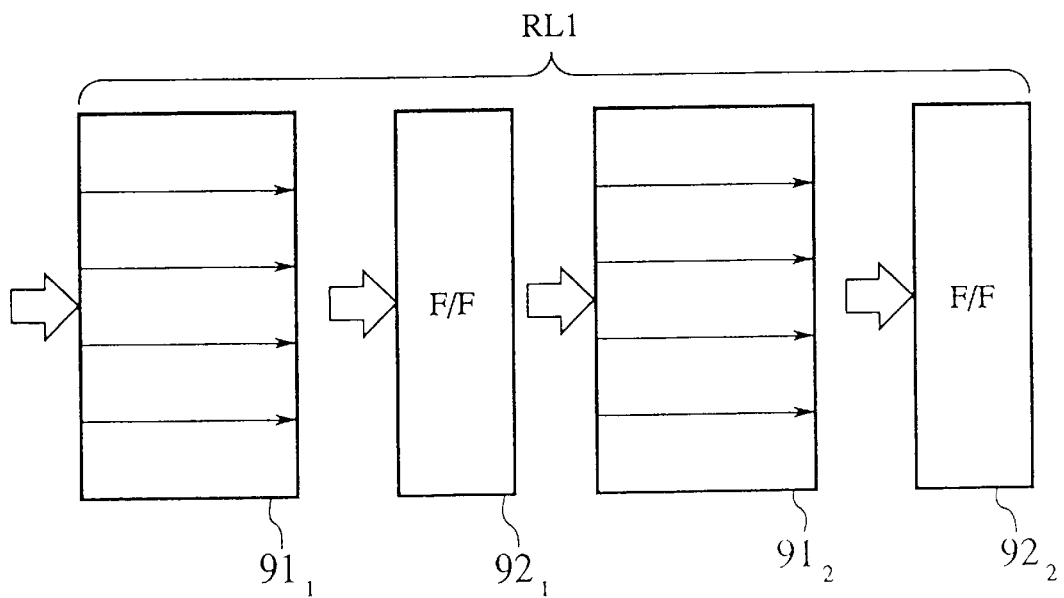
FIG. 9 is a block diagram showing a structure of function blocks RL1–RL5 shown in FIG. 8.

As shown in FIG. 9, the function blocks RL1–RL5 comprises a plurality of combinational circuits $91_1$, $91_2$, ... and a plurality of flip-flops (F/F) $92_1$, $92_2$ .... As shown in FIG. 9, generally these combinational circuits and flip-flops form a plurality of signal paths.

About the combinational circuit of the present embodiment shown in FIG. 7, only part of the function blocks RL1–RL5 (hereinafter referred to as partial circuit) is shown to simplify the description.

Figure 10:
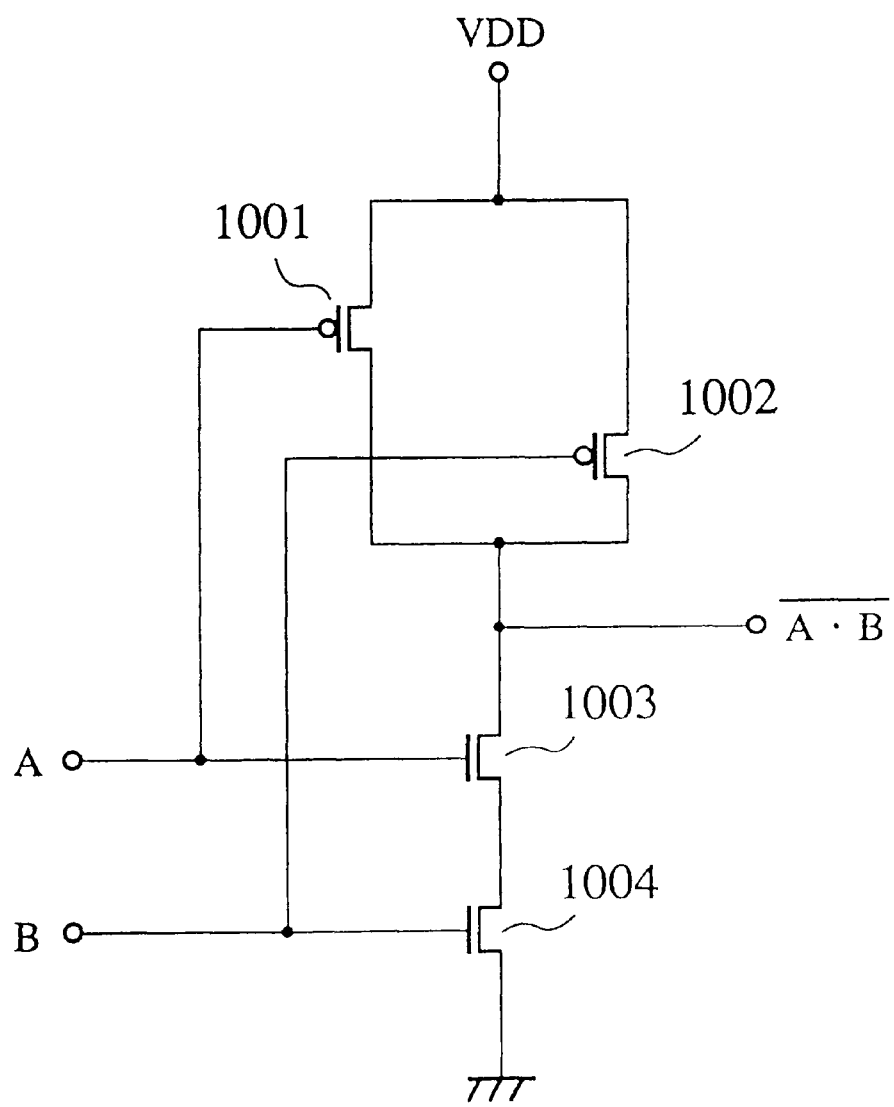
FIG. 10 is a circuit diagram of an NOT-AND gate which is an example of the gate.

This partial circuit includes two input terminals I1, I2, two output terminals O1, O2, seven gates 1–4, 11–13 and two level converters 14, 15. Three gates 1, 2, 13 are gates (VDDH gate) in which the standard power voltage VDDH is applied and four gates 3, 4, 11, 12 are gages (VDDL gate) in which power voltage lower than the standard (VDDL) is applied. FIG. 10 shows a circuit diagram of CMOS 2 input NAND gate as an example of the gate. This circuit comprises four MOSs 1001, 1002, 1003, 1004. Here, the gate in which the standard voltage is applied to the power voltage VDD is VDDH gate and the gate in which a lower voltage than the standard voltage is applied to the power voltage VDD is VDDL gate.

Because the output of the VDDL gate 12 cannot drive directly the VDDH gate 13, a level converter 15 is inserted therebetween.

As for the specification of the circuit, assuming that the standard voltage, (0-VDDH) is inputted to the input terminals I1, I2 and the standard voltage (0-VDDH) is outputted outside from the output terminals O1, O2, the VDDL gate 4 cannot output the VDDH level directly to the output terminal O1. Therefore a level converter 14 is inserted between the VDDL gate 4 and the output terminal O1.

The partial circuit shown in FIG. 7 has three signal paths. A first path P1 is a path from the input terminal I1 to the output terminal O1 (input terminal I1→gate 1→gate 2→gate 3→gate 4→level converter 14→output terminal O1). A second path P2 is a path from the input terminal I1 to the output terminal O2 (input terminal I1→gate 1→gate 2→gate 13→output terminal O2). A third path P3 is a path from the input terminal I2 to the output terminal O2 (input terminal I2→gate 11→gate 12→level converter 15→gate 13→output terminal O2).

Although it is assumed that the VDDH level is output to the output terminals O1, O2 in a following description, if the output terminals O1, O2 may have the VDDL level output, the level converter 14 is not required.

The feature of the circuit structure of the present invention exists in that following multiple input VDDH gate is included. That is, in the multiple input VDDH gate, the output of the VDDH gate is connected to one or more inputs and the output of the VDDL gate is connected to remaining one or more inputs through a level converter. In the example shown in FIG. 7, the gate 13 is such a gate.

In a case in which the output of the VDDL gate is connected to the input of the VDDH gate, driving voltage is not sufficient without any special procedure and therefore a necessity of inserting the level converter arises. However, the level converter itself consumes electric power. If possible, it is required that the gate of the input side is VDDH gate and the gate of the output side is VDDL gate, thereby minimizing the number of the level converter.

If this is followed strictly, in a case when a gate is determined to be the VDDH gate based on the timing restrictions of the path, even if there is sufficient allowance in the timing restriction of another path which passes that gate, the gates on the input side with respect to that gate cannot be changed to a VDDL gate.

In the circuit structure of the present invention, insertion of the level converter is suppressed by using the VDDH gate as the input side gate and the VDDL gate as the output side gate. However, in a path having an allowance in timing restriction, the level converter are inserted in front of the VDDH gates, and the VDDL gates are applied to the gates on the input side with respect to that VDDH gate, so that a further reduction of power consumption is achieved.

In an example shown in FIG. 7, the gate 13 is VDDH gate because of the timing restriction on the path P2. In the path P3 having an allowance in timing of passing the gate 13, the level converter 15 is inserted and the VDDL gates are employed for the gates 11, 12.

Next, a design method for converting the partial circuit shown in FIG. 6A in which all the gates are formed of the VDDH gates to a low power consumption electrical structure as shown in FIG. 7 will be described.

This design method can be explained simply as follows. First, when the power voltage is lowered to VDDL level gradually from the output side gate, a gate which becomes incapable of satisfying the timing restriction given to that path first of all is found out, and that gate and all the gates located on the input side with respect thereto on the path are supplied with appropriate marks.

With respect to all of the paths that are given the timing restriction, after the aforementioned processing is completed, all of the power voltages of the marked gates are regarded as the VDDH level, and the power voltages of all the gates that have been unmarked in the end, that is, all the gates which have not been assumed to be the VDDH gate in the end, are regarded as the VDDL level.

Finally, a level converter for converting the amplitude of voltage from VDDL level to VDDH level is inserted into a portion in which the output of a gate in which the power voltage is VDDL level is connected to the input of a gate in which the power voltage is VDDH level or the output terminal of the partial circuit.

Hereinafter, an example of the design method for the partial circuit will be described with reference to a flow chart shown in FIG. 11.

Figure 6A:
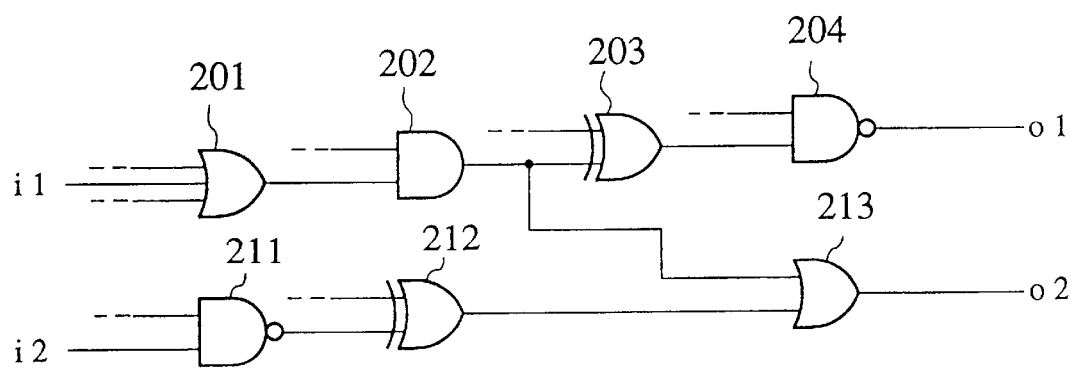
FIGS. 6A, 6B are circuit diagrams for explaining a subject of the second prior art example.
Figure 6B:
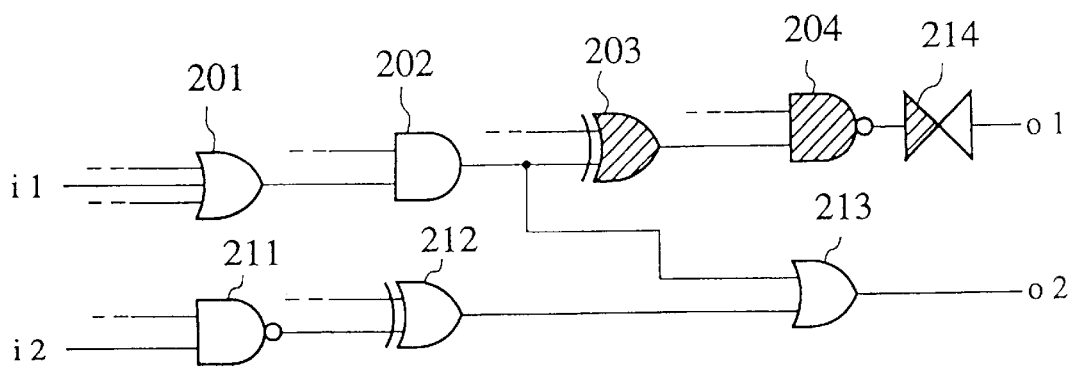

Assume that three paths (first path P1, second path P2, third path P3) exist in a partial circuit shown in FIG. 6A and as the specification of the circuit, the paths P1, P2, P3 are provided with timing restrictions T1, T2, T3 which should be satisfied. Because the objective gates 201–204, 211–213 of the partial circuit shown in FIG. 6A correspond to the gates 1–4, 11–13 shown in FIG. 7, the reference numerals of FIG. 7 will be used in a following description.

In step S1, the circuit shown in FIG. 6A is assumed to be C and the processing proceeds to step S2. In step S2, the three paths P1, P2, P3 in the circuit C are provided with the timing restriction T1, T2, T3, and any of them has not been treated. Therefore, the processing proceeds to step S3. In step S3, of paths to which the timing restriction is given, one of the untreated paths is selected. For example, if the path P1 is selected, the path P1 is assumed to be P and the timing restriction T1 for the path P1 is assumed to be T, and then the processing proceeds to step S4. In step S4, of the gates on the path P (=P1), the gate 4 nearest the output side is assumed to be G and then processing proceeds to step S5. In step S5, the gate G (gate 4) is temporarily converted to VDDL gate and in step S6, the total delay time of the path P (=P1) is calculated and this time is assumed to be D. D is longer than the total delay time of the path P1 in the case when the gate 4 is VDDH gate.

In step S7, depending on the total delay time D of the path P (=P1) and the timing restriction T (=T1) of the path P, step S8 or step S10 is selected. Here, assuming that the total delay time D is less than the timing restriction T, the processing proceeds to step S8.

In step S8, of the gates located on the path P (=P1), the gate nearest to the input side is gate 1, not gate G (=gate 4) and therefore the processing proceeds to step S9. In step S9, of the gates located on the path P (=P1), the gate 3 nearer the input side by one step than the gate G (=gate 4) is assumed to be G and then the processing returns to step S5.

At this time, in step S5, the gate G (gate 3) is converted to VDDL gate and further, in step S6, the total delay time of the path P (=P1) is calculated and this time is assumed to be D. D is longer than the previously calculated value. In step S7, assuming that the total delay time D of the path P (=P1) is less than the timing restriction T (=T1) of the path P, the processing proceeds to step S8.

In step S8, because the gate G (=gate 3) is not a gate nearest to the input side on the path P (=P1), the processing proceeds to step S9. In step S9, of the gates located on the path P (=P1), the gate 2 nearer the input side by one side than the gate G (=gate 3) is assumed to be G and the processing returns to step S5.

In step S5, the gate G (=gate 2) is converted to VDDL gate and further in step S6, the total delay time of the path P (=P1) is calculated and this time is assumed to be D. In step S7, if the total delay time D of the path P (=P1) is assumed to be longer than the timing restriction T (=T1) of the path P, the processing proceeds to step S10.

In step S10, of the gates located on the path P (=P1), the gate G (=gate 2) and all the gates (=gate 1) nearer the input side than the G are marked and then processing proceeds to step S11. In step S11, all the gates (gates 2, 3, 4) which were temporarily converted to VDDL gate in step S5 are returned to VDDH gate and the processing returns to step S2.

At this time, in step S2, of the paths located in the circuit C and which are given the timing restriction, the paths P2 and P3 have not been treated. Therefore, the processing proceeds to step S3. In step S3, of the paths which are given the timing restriction, one untreated path is selected. If for example the path P2 is selected, the path P2 is with respect to the path P, and the timing restriction T2 assumed to be P2 is with respect to the path T, and then the processing proceeds to step S4.

In step S4, of the gates located on the path P (=P2), the gate 13 nearest the output side is assumed to be G and in the subsequent step S5, the gate G (=gate 13) is assumed to be VDDL gate. Further in step S6, the total delay time of the path P (P2) is calculated and this time is assumed to be D.

In step S7, if the total delay time D of the path P (=P2) is longer than the timing restriction T (=T2) of the path P only by converting the gate 13 to VDDL gate in step S5, for example because the path P2 is a critical path of the circuit C, the processing proceeds to step S10.

At this time, in step S10, of the gates located on the path P (=P2), the gate G (=gate 13) and all the gates (=gates 1, 2) nearer the input side than the G are marked. Then, in step S11, all the gates (gate 13) which were temporarily converted to VDDL gate in step S5 are returned to VDDH gate and the processing returns to step S2.

At this time, in step S2, of the paths located in the circuit C and which are given the timing restriction, the path P3 has not been treated and therefore the processing proceeds to step S3. In step S3, of the paths which are given the timing restriction, one untreated path is selected. Because the path P3 remains as an only untreated path, the path P3 is assumed to be P and the timing restriction T3 for the path P3 is assumed to be T.

Further, in step S4, of the gates located on the path P (=P3), the gate 13 nearest the output side is assumed to be G and in the subsequent step S5, the gate G (=gate 13) is converted to VDDL gate. Further in the step S6, the total delay time of the path P (=P3) is calculated and this time is assumed to be D.

In step S7, assuming that the total delay time D of the path P (=P3) is less than the timing restriction T (=T3) of the path P, the processing proceeds to step S8. In step S8, because the gate (=gate 13) is not a gate nearest the input side on the path P (=P3), the processing proceeds to step S9. In step S9, of the gates located on the path P (=P3), a gate nearer the input side by one step than the gate G (=gate 13) is assumed to be G and the processing returns to step S5.

At this time, in step S5, the gate G (=gate 12) is converted to VDDL gate and further in step S6, the total delay time of the path P (=P3) is calculated and this time is assumed to be D. In step S7, assuming that the total delay time D of the path P (=P3) is less than the timing restriction T (=T3) of the path P, the processing proceeds to step S8. In step S8, because the gate G (=gate 12) is not a gate nearest the input side on the path P (=P3), the processing proceeds to step S9. Of the gates located on the path P (=P3), the gate 11 nearer the input side by one step than the gate G(=gate 12) is assumed to be G and the processing returns to step S5.

At this time, in step S5, the gate G (=gate 11) is converted to VDDL gate and further in step S6, the total delay time of the path P (=P3) is calculated and this time is assumed to be D. In the subsequent step S7, assuming that the total delay time D of the path P (=P3) is less than the timing restriction T (=T3) of the path P, the processing proceeds to step S8. In step S8, because the gate G (=gate 11) is a gate nearest the input side on the path P (=P3), the processing proceeds to step S11. In step S11, all the gates (=gates 11, 12, 13) on the path P (=P3) are converted to VDDH gate and the processing returns to step S2.

Because in step S2, all the paths given the timing restriction of the paths located in the circuit C have been treated, the processing proceeds to step S12. In step S12, of the gates located in the circuit C, the marked gates (=gates 1, 2, 13) are ascertained to be VDDH gate and not marked gates (=gates 3, 4, 11, 12) are ascertained to be VDDL gate. Then the processing proceeds to step S13.

In step S13, because the output of the VDDL gate and the input of the VDDH gate are connected to each other, the level converter 15 is inserted between the VDDL gate 12 and the VDDH gate 13. At this time, if there is a path which cannot satisfy the timing restriction because the delay time increases as a result of insertion of the level converter 15, the size (transistor size) of each path or part or all the gates is enlarged or part of the VDDL gates on the path is converted to VDDH gate thereby shortening the total delay time of the path so as to satisfy the timing restriction.

Then, because the VDDL gate 4 is connected between the circuit C and the output terminal O1 in step S14, the level converter 14 is inserted between the output terminal O1 and the VDDL gate 4, and the processing is terminated.

By the method according to the above described procedure, the partial circuit shown in FIG. 6A in which all the gates are formed of VDDH gates can be converted effectively to a partial circuit containing the VDDL gates as shown in FIG. 7 while the timing restriction for each path is satisfied.

As described above, when two kinds of power voltages (VDDH and VDDL) are used at the same time, a magnitude of power voltage to be applied to each gate is determined so that, in each path, the VDDH gates are placed continuously on the input side if possible, and the VDDL gates are placed continuously on the output side. As a result, only by inserting a small number of the level converters, as many gates as possible can be converted to VDDL gates so that the effect of reduction of consumption power is large.

As described above, the level converter is required only in a case in which in a multiple input VDDH gate, VDDH gates are connected to one or more input thereof and the VDDL gates are connected to one or more inputs through a level converter, as well as for the output terminal for output outside. This structure may appear when, when a gate G is converted to VDDL gate, a path (aforementioned path P3) passing that gate G has a sufficient allowance of timing and another path (aforementioned path P2) passing the same gate G becomes incapable of satisfying the timing restriction. In this case, the gate G and all the gates on the input side with respect thereto, on the path P2 are determined to be VDDH gate and some of the gates on the path P3 on the input side with respect to the gate G can be converted to VDDL gate. Therefore, in this case, the level converter (aforementioned level converter 15) is inserted between the gate G and VDDL gate.

The present embodiment has the following advantages.

By converting the input side gates to VDDH gate and the output side gates to VDDL gate, the insertion of the level converter can be minimized. As a result, as many gates as possible can be converted to VDDL gates and it is possible to greatly reduce the consumption of power and further it is possible to suppress an increase in the chip area.

Further, for a path having an allowance for the timing restriction, the level converter is inserted in front of the VDDH gate and the gates on the input side with respect to the VDDH gate are converted to VDDL gates, thereby making it possible to reduce power consumption further. That is, in a case when the power voltage of a predetermined gate (gate 13) cannot be lowered to the VDDL level because of the timing restriction of a path, the gates (gates 11, 12) on the input side with respect to that gate, on another path (path P3) passing the same gate can be lowered to VDDL level if there is an allowance in timing.

By using the design method for the aforementioned combinational logic circuit, the combinational logic circuit shown in FIG. 7 can be effectively designed.

Next, a second embodiment of the present invention will be described.

Figure 12:
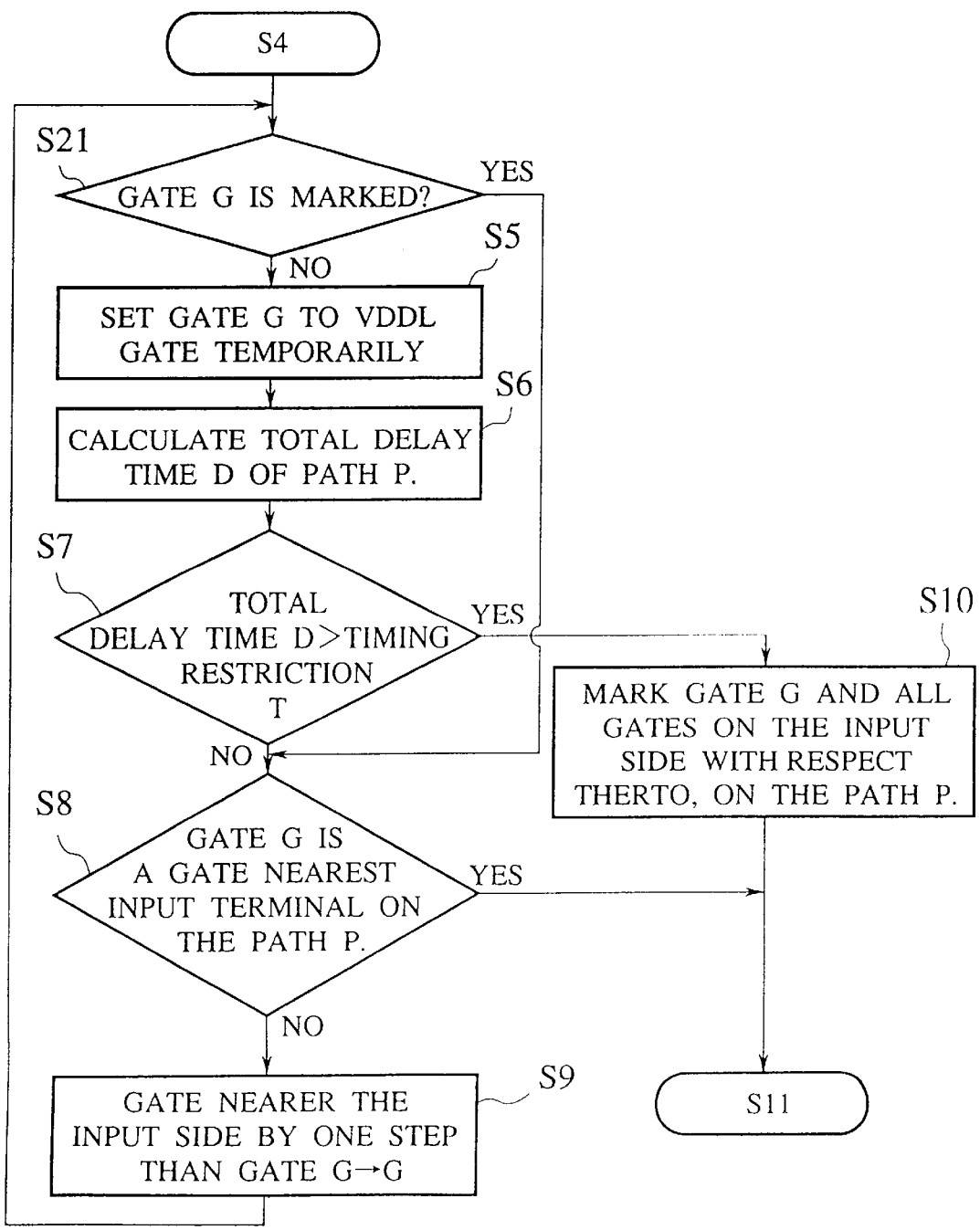
FIG. 12 is a flow chart showing a design method for the combinational logic circuit according to the second embodiment of the present invention.

FIG. 12 is a flow chart showing a design method for the combinational logic circuit according to the second embodiment of the present invention.

Figure 11:
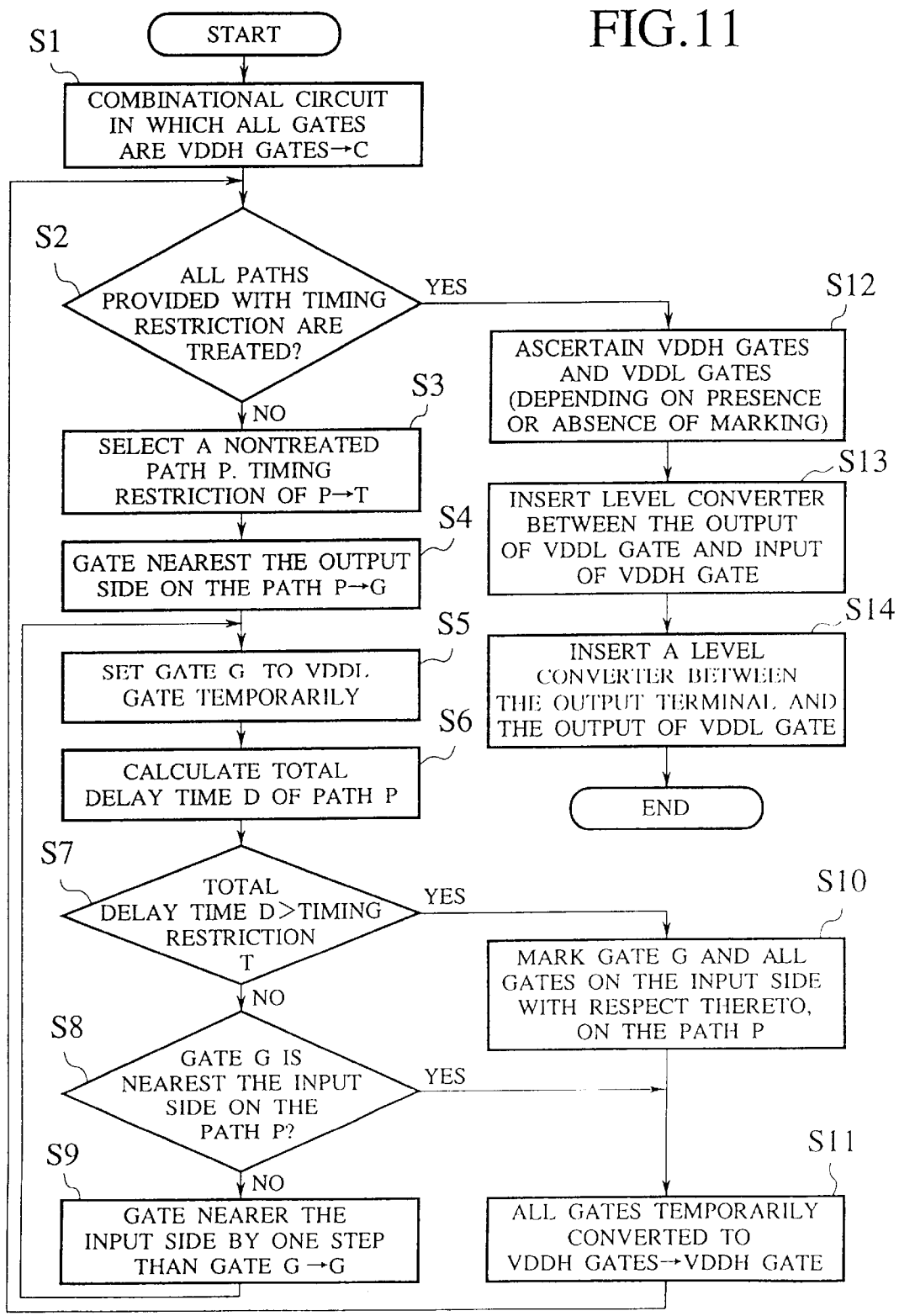
FIG. 11 is a flow chart showing a design method for the combinational logic circuit according to a first embodiment.

The design method of the second embodiment is that in the design method of the first embodiment shown in FIG. 11, after step S4 or step S9 is completed and before the step S5 is executed, step S21 for investigating whether or not the gate G has been marked is provided and in this step S21 is added a processing in which the processing proceeds to step S8 while skipping the steps S5–S7 if it has been marked.

This design method will be explained by using the partial circuit shown in FIGS. 13A, 13B and 13C.

Figure 13A:
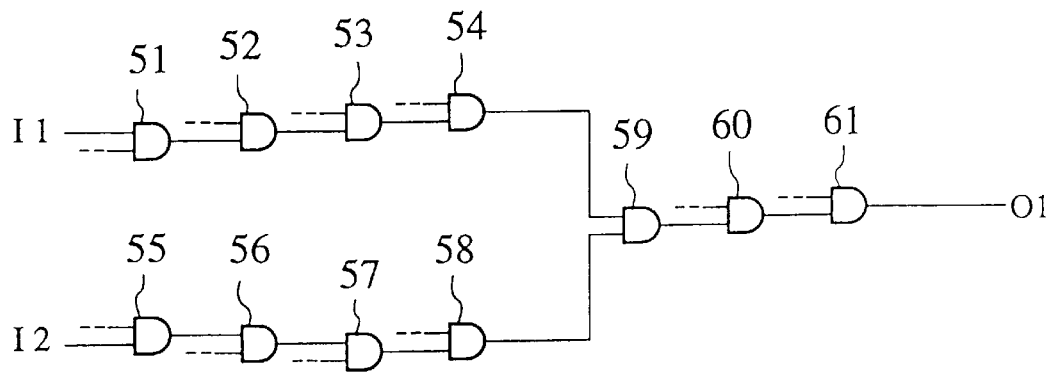
FIGS. 13A, 13B, 13C are partial circuit diagrams of the combinational logic circuits for explaining the second embodiment.
Figure 13B:
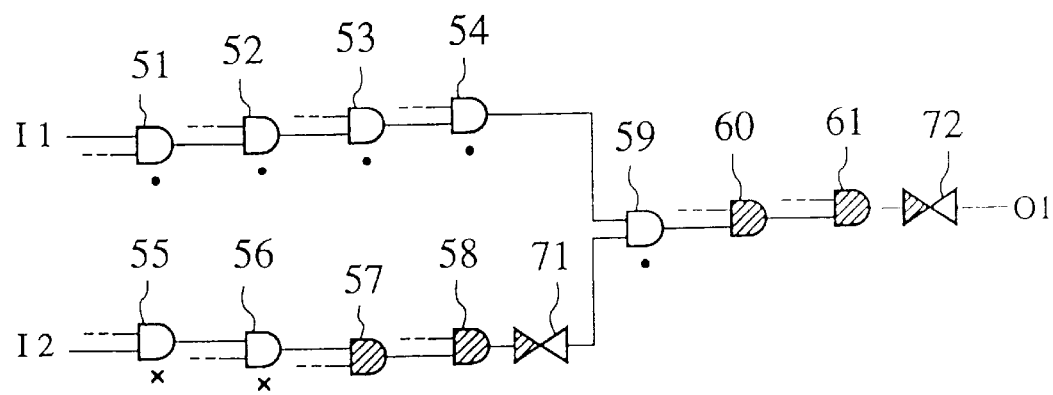
Figure 13C:
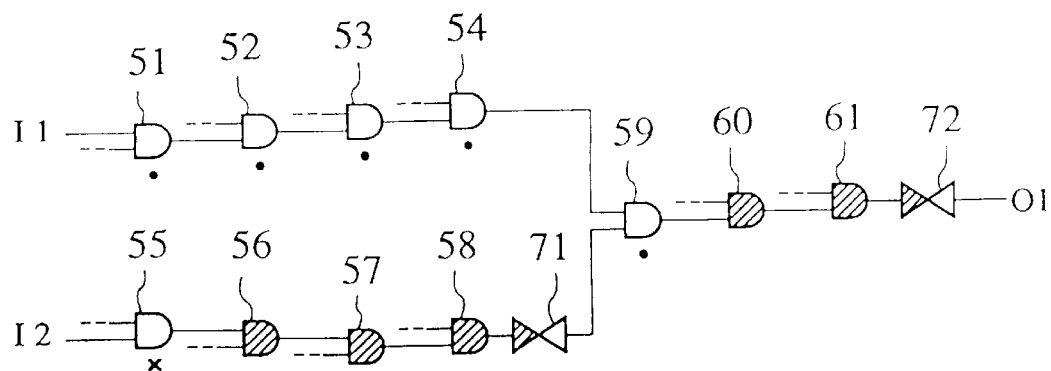

The partial circuit shown in FIG. 13A is taken as an objective of this design. It is assumed that this partial circuit C contains two input terminals I1, I2, one output terminal O1 and eleven VDDH gates 51–61, and the two paths P11, P12 are provided with the timing restrictions T11, T12. Here, the path P11 is a path from the input terminal I1 to the output terminal O1 (input terminal I1→gate 51→gate 52→gate 53→gate 54→gate 59→gate 60→gate 61→output terminal O1). The path P12 is a path from the input terminal I2 to the output terminal O1 (input terminal I2→gate 55→gate 56→gate 57→gate 58→gate 59→gate 60→gate 61→output terminal O1).

A case in which the aforementioned design method of the first embodiment is applied to this partial circuit C will be described. First, it is assumed that, in the processing of the path P11, although even if two gates of the gates 61 and 60 are converted to VDDL gates, the timing restriction T11 can be satisfied, if three gates including the gate 59 is converted to VDDL gates, the T11 cannot be satisfied. In this case, as shown in FIG. 13B, the gates 51–54 and the gate 59 totaling five gates are marked (see black circles of FIG. 13B).

Next, it is assumed that, in the processing of the path P12, although the timing restriction T12 can be satisfied even if the gates 61, 60, 59, 58 and 57 totaling five gates are converted to VDDL gates, if six gates including the gate 56 are converted to VDDL gates, the T12 cannot be satisfied. In this case, two gates of the gates 55 and 56 are marked (see cross mark of FIG. 13B).

As shown in FIG. 13A, the gates 57, 58, 60, 61 provided with no mark, totaling four gates are ascertained to be VDDL gate and the remaining seven gates are ascertained to be VDDH gate.

However, because, in the treatment of the path P11, the gate 59 is marked, calculation of the total delay time by temporarily converting the gate 59 to VDDL is a waste. This is because as long as marked, the gate 59 is finally ascertained to be VDDH gate.

Therefore, if, in the treatment of the path P12, the gates 61, 60, 58, 57, 56 totaling five gates are converted to VDDL gates while skipping the gate 59 already marked, there is a possibility that the timing restriction T12 is satisfied. Assuming that this can be satisfied and that the T12 cannot be satisfied if six gates including the gate 55 are converted to VDDL gate, the gate which is marked in the treatment of the path P12 is only the gate 55. Thus, as shown in FIG. 13C, finally the gate 56 is also ascertained to be VDDL gate.

Also, the provision of the level converter 71 between the VDDL gate 58 and the VDDH gate 59 and further provision of the level converter 72 between the output terminal O1 and the VDDL gate 61 are the same as in the aforementioned first embodiment.

Because the already marked gates are gates which are determined to be VDDH gate by the timing restriction of another path previously treated, these gates are skipped and then the non-marked gates are changed to VDDL gates. As a result, as many gates as possible can be converted to VDDL gates.

According to the design method of the present embodiment, the power voltages of more gates than in the design method of the first embodiment can be reduced so that the combinational logic circuit can be more effectively designed.

Further, because upon realizing the combinational logic circuit using the design method of the present embodiment, the input side gates and output side gates can be converted to VDDH gates and VDDL gates respectively as long as it is possible, the insertion of the level converter can be minimized. Thus, additional gates can be converted to VDDL gates so that the power consumption can be largely reduced and an increase of chip area can be restricted.

Because according to the design method of the second embodiment, its result may change depending on the order of treatment of the path, if the order of treatment of the paths is determined by an empirical method such as treating a path having less allowance in timing restriction with preference, a more effect can be expected.

Next, a case in which the combinational logic circuit of the present invention is applied to a circuit composing the processor will be described.

Figure 1:
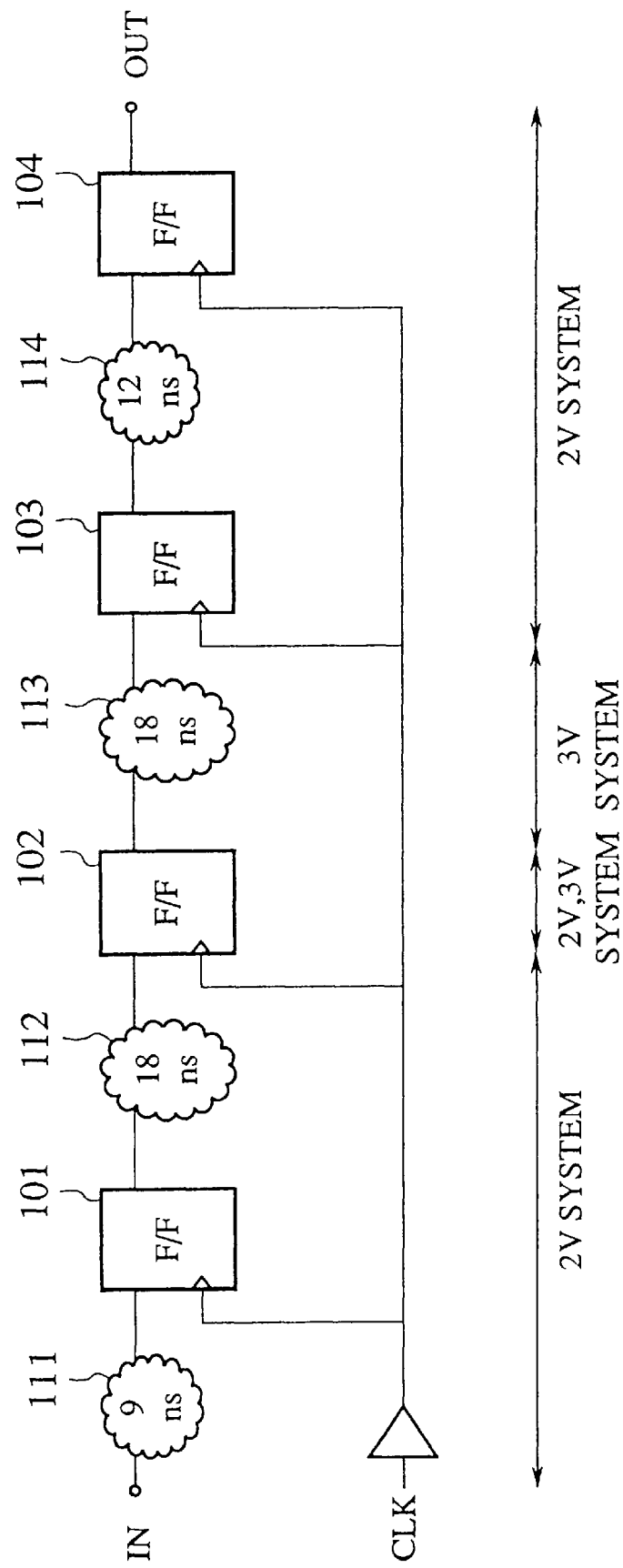
FIG. 1 is a block diagram showing a first prior art example.
Figure 2:
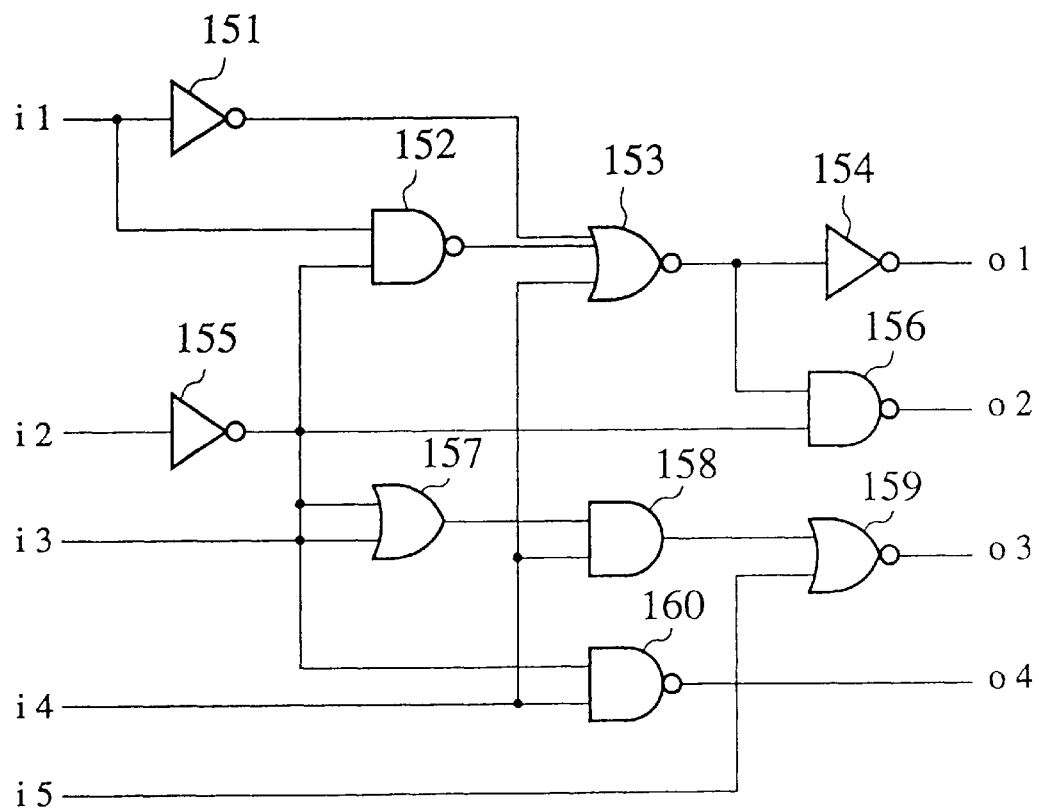
FIG. 2 is a circuit diagram showing an example of a combinational circuit in a semiconductor integrated circuit.
Figure 3:
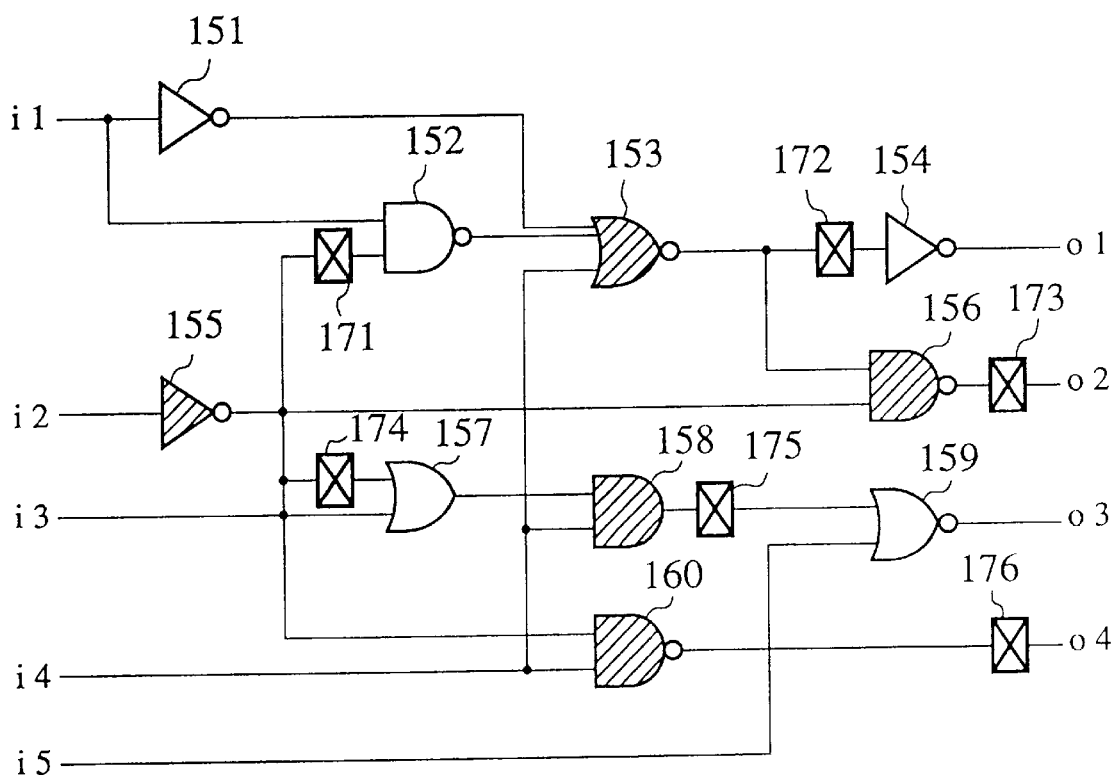
FIG. 3 is a circuit diagram showing a result of a case in which a prior art design method is applied to the combinational circuit shown in FIG. 2.
Figure 4:
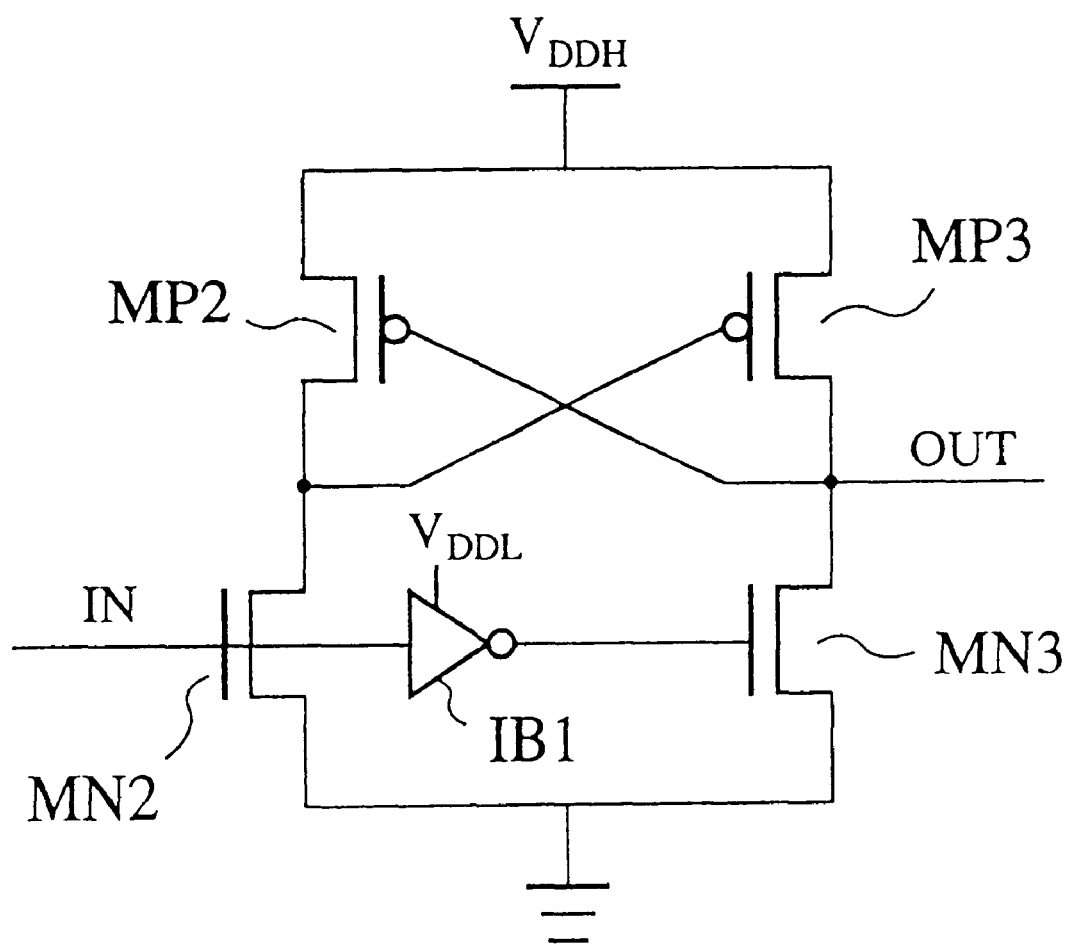
FIG. 4 is a circuit diagram showing an example of a level converter.
Figure 5:
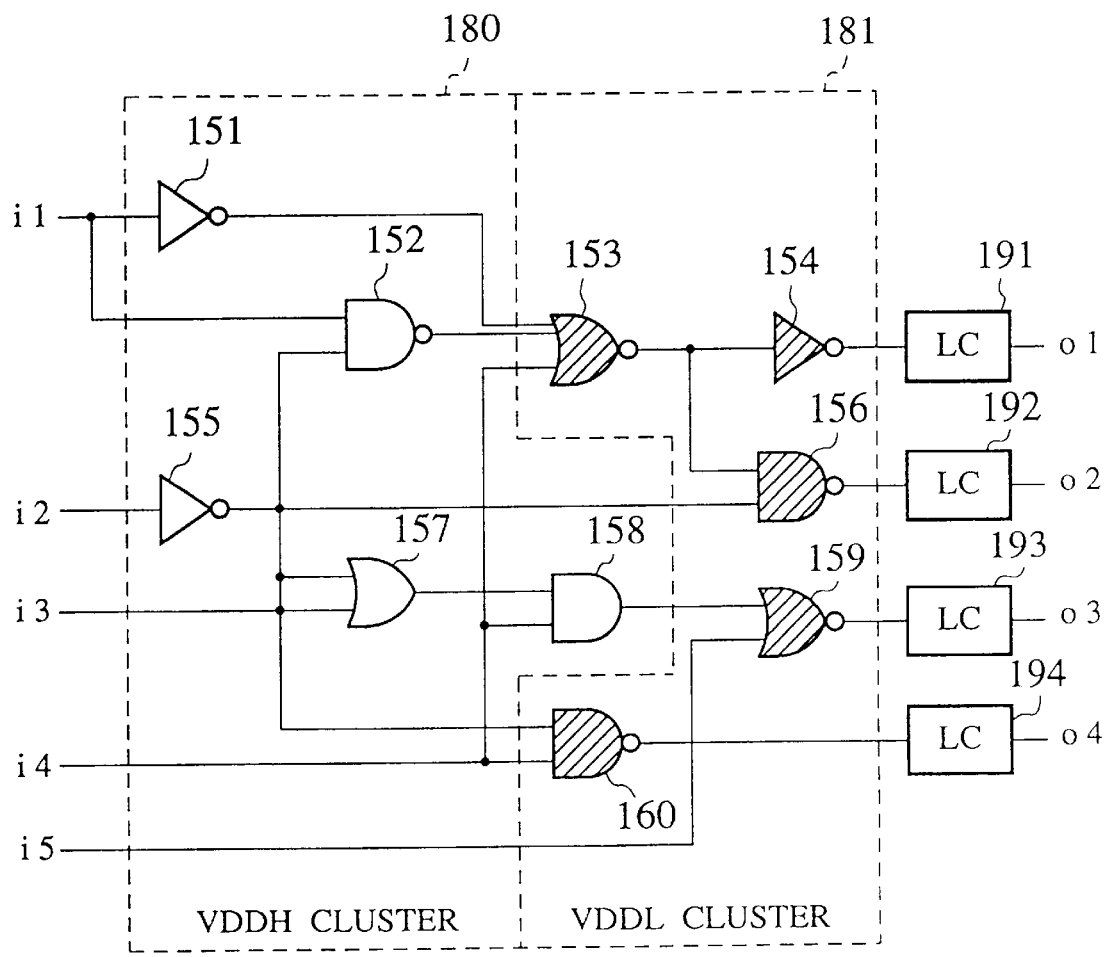
FIG. 5 is a circuit diagram of a combinational circuit which is a second prior art example.
Figure 14:
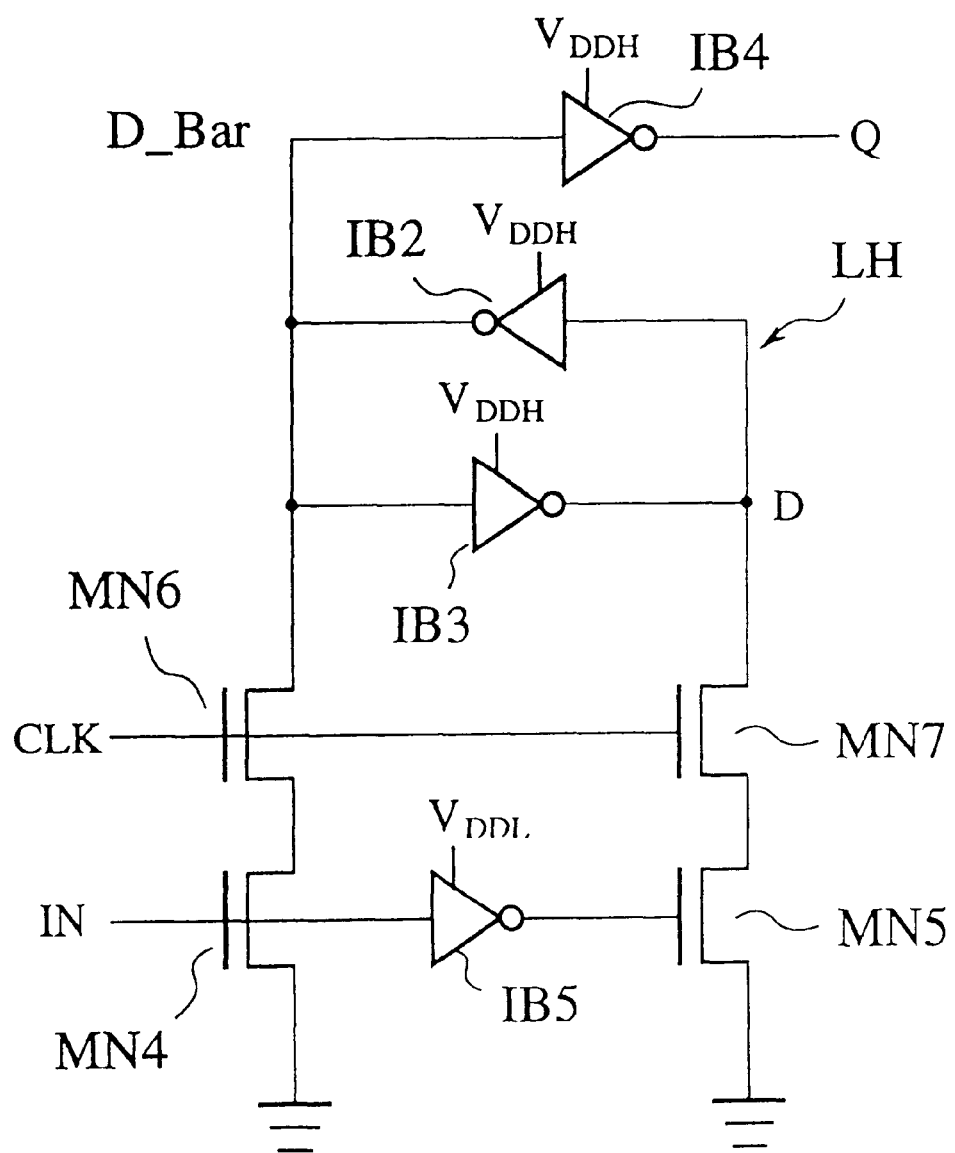
FIG. 14 is a circuit diagram of a level conversion function provided latch.

In the control logic of the processor, in many cases, the primary output terminals of the combinational logic circuit are provided with latch. In such a case, as a level converter connected to the primary output terminal, a "level conversion function provided latch", in which the level converter and latch are mixed as shown in FIG. 14 can be used instead of the circuit shown in FIG. 4. This circuit contains a function for latching signals and a function for converting the operating voltage VDDL to the operating voltage VDDH.

This level conversion function provided latch includes a latch circuit LH which is operated under the operating voltage VDDH. The latch circuit LH comprises a pair of inverters IB2, IB3 the input and output nodes of which are connected reversely. Then, its output is connected to the input of the inverter IB4 operated under the operating voltage VDDH and the output of the inverter IB4 is the primary output terminal. One side of the inverter is connected to ground level through N-channel transistor MN4 and the other side thereof is connected to the ground level through a N-channel transistor MN5.

The N-channel transistors MN4, MN5 are operated with the operating voltage VDDL and turned ON/OFF by inputting an output signal of a gate (not shown) operated also by the operating voltage VDDL. However, because the inverter IB5 is provided between the MN4 and MN5, when one of them is turned ON, the other is turned OFF. Further between the latch circuit LH and N-channel transistors MN4, MN5, N-channel transistors MN6, MN7 which fetch signals into the latch circuit LH by synchronizing with clock signal CLK are provided.

A circuit shown in FIG. 14 attains both the level conversion function and latch function with a substantially the same power consumption as ordinary latch circuit. From viewpoint of reduction of the power consumption, this is an effective circuit.

In a case when in the combinational logic circuit of the present invention, the level conversion function provided latch shown in FIG. 14 is utilized as a level converter, the level conversion function provided latch must be applied to the level converter provided on the primary output terminal side. This is because the level conversion function provided latch can only used in a place where the latch is originally provided.

As described in detail above, according to the present invention, the power voltage of partial gates on a path excluding critical path or a path having an allowance in timing is reduced to a second operating voltage which is lower than a first operating voltage. Within a range in which the timing restriction is satisfied, power consumption can be reduced. Further, only by inserting a small number of the level converters, it is possible to reduce the power voltages of more gates. Thus, for example if the power voltage of a predetermined logic gate cannot be reduced to the second operating voltage because of the timing restriction of a path, the power voltage of only gates located on the input side with respect to that gate, on another path passing the same gate can be reduced to the second operating voltage if there is an allowance in timing.

It should be understood that many modifications and adaptations of the invention will become apparent to those skilled in the art and it is intended to encompass such obvious modifications and changes in the scope of the claims appended hereto.

What is claimed is:

1. A design method for a combinational logic circuit for designing the combinational logic circuit having at least one primary input terminal, at least one primary output terminal and logic gates connected therebetween, said design method comprising:

a first step for designing a logic circuit which satisfies a predetermined timing restriction when a first operating voltage is supplied to said logic gates; and a second step for considering whether or not said first operating voltage can be changed to a second operating voltage which is lower than said first operating voltage, with respect to every logic gate from a logic gate nearest an output side on each path specified by said timing restriction, said second step including a step in which, when the timing restriction cannot be satisfied for said path in a case in which said second operating voltage is newly supplied to one of said logic gates, the voltage to be supplied to said newly supplied logic gate and all logic gates on said path located on the input side with respect to said newly supplied logic gate is determined to be said first operating voltage, and wherein, after said second step is executed with respect to all paths specified by said timing restriction, it is determined that said first operating voltage is supplied to a logic gate at least once determined to be supplied with said first operating voltage and that said second operating voltage is supplied to a logic gate never determined to be supplied with said first operating voltage.

2. A design method for a combinational logic circuit for designing the combinational logic circuit having at least one primary input terminal, at least one primary output terminal and logic gates connected therebetween, said design method comprising:

a first step for designing a logic circuit which satisfies a predetermined timing restriction when a first operating voltage is supplied to said logic gates; and a second step for considering whether or not said first operating voltage can be changed to a second operating voltage which is lower than said first operating voltage, with respect to every logic gate from a logic gate nearest an output side on each path specified by said timing restriction, said second step including a step for inhibiting a supply of said second operating voltage to a logic gate determined to be supplied with said first operating voltage; and a step in which, when the timing restriction cannot be satisfied for said path in a case in which said second operating voltage is newly supplied to one of said logic gates, the voltage to be supplied to said newly supplied logic gate and all gates on said path located on an input side with respect to said supplied logic gate is determined to be said first operating voltage, wherein, after said second step is executed with respect to all paths specified by said timing restriction, it is determined that said first operating voltage is supplied to a logic gate at least once determined to be supplied with said first operating voltage and that said second operating voltage is supplied to a logic gate never determined to be supplied with said first operating voltage.

* * * * *